United States Patent
Chew et al.

(10) Patent No.: US 9,886,071 B2
(45) Date of Patent: Feb. 6, 2018

(54) MEMORY STORAGE DEVICE AND POWER MANAGEMENT METHOD THEREOF

(71) Applicant: PHISON ELECTRONICS CORP., Miaoli (TW)

(72) Inventors: Zeh-Yang Chew, Perlis (MY); Shou-Chih Lee, Hsinchu County (TW); Po-Chun Hsieh, Kaohsiung (TW); Yun-Chieh Chen, Miaoli County (TW); I-Chung Tsai, Hsin-Chu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 75 days.

(21) Appl. No.: 15/210,905

(22) Filed: Jul. 15, 2016

(65) Prior Publication Data

US 2017/0329381 A1  Nov. 16, 2017

(30) Foreign Application Priority Data

May 13, 2016  (TW) .............................. 105114852 A

(51) Int. Cl.
*G06F 1/26* (2006.01)
*G06F 1/30* (2006.01)
*G06F 1/32* (2006.01)

(52) U.S. Cl.
CPC .............. *G06F 1/30* (2013.01); *G06F 1/3203* (2013.01)

(58) Field of Classification Search
CPC ....................................................... G06F 1/30
(Continued)

(56) References Cited

U.S. PATENT DOCUMENTS

| 6,991,483 B1* | 1/2006 | Milan | H01R 27/00 439/171 |
| 2005/0077869 A1* | 4/2005 | Yueh | G06F 1/266 320/114 |

(Continued)

FOREIGN PATENT DOCUMENTS

TW   201535100   9/2015

OTHER PUBLICATIONS

Kevin Tofel, Office tool: A flash drive with integrated, fast USB charger Apr. 27, 2015.*

(Continued)

*Primary Examiner* — Jaweed A Abbaszadeh
*Assistant Examiner* — Volvick Derose
(74) *Attorney, Agent, or Firm* — JCIPRNET

(57) ABSTRACT

A memory storage device having a rewritable non-volatile memory module, a first connection interface unit, a second connection interface unit, a power management circuit and a memory control circuit unit is provided. When an external power supply device is electrically connected to the second connection interface unit, the power management circuit receives a second power supply voltage from the external power supply device via the second connection interface unit, supplies an operation voltage to the rewritable non-volatile memory module and the memory control circuit unit and supplies the second power supply voltage to a host device. When the external power supply device is electrically disconnected with the second connection interface unit, the power management circuit receives a first power supply voltage from the host device via the first connection interface unit and supplies the operation voltage to the memory control circuit unit and the rewritable non-volatile memory module.

17 Claims, 7 Drawing Sheets

(58) Field of Classification Search
USPC .......................................................... 713/300
See application file for complete search history.

(56) References Cited

U.S. PATENT DOCUMENTS

| | | | | |
|---|---|---|---|---|
| 2006/0028803 A1* | 2/2006 | Pocrass | ................ | G06K 19/077 |
| | | | | 361/737 |
| 2007/0229025 A1* | 10/2007 | Tsai | .................. | H01R 13/2442 |
| | | | | 320/111 |
| 2007/0239924 A1* | 10/2007 | Foo | ...................... | G06F 13/385 |
| | | | | 710/316 |
| 2009/0193156 A1 | 7/2009 | Suematsu | | |
| 2010/0030929 A1* | 2/2010 | Ben-Yacov | ........... | G06F 13/385 |
| | | | | 710/33 |
| 2010/0036993 A1* | 2/2010 | Kular | ........................ | G06F 1/26 |
| | | | | 710/313 |
| 2011/0309789 A1* | 12/2011 | Prasad | .................. | H02J 7/0052 |
| | | | | 320/107 |
| 2012/0117409 A1* | 5/2012 | Lee | ........................... | G06F 1/26 |
| | | | | 713/340 |
| 2012/0303882 A1* | 11/2012 | Hershler | ............. | G06F 13/4027 |
| | | | | 711/103 |
| 2014/0032943 A1* | 1/2014 | Goel | .................... | G06F 11/1456 |
| | | | | 713/300 |
| 2014/0281139 A1* | 9/2014 | Smurthwaite | ....... | G06F 12/0246 |
| | | | | 711/103 |
| 2016/0070313 A1* | 3/2016 | Wu | .................. | G06K 19/07732 |
| | | | | 361/679.32 |
| 2016/0191313 A1* | 6/2016 | Chen | .................... | H04L 41/0816 |
| | | | | 370/315 |
| 2016/0335222 A1* | 11/2016 | Schnell | ................ | G06F 13/4286 |
| 2016/0336694 A1* | 11/2016 | Chang | ................. | G06F 13/4282 |
| 2016/0336775 A1* | 11/2016 | Cho | ....................... | H02J 7/0042 |
| 2017/0017595 A1* | 1/2017 | Schnell | .................. | G06F 13/385 |
| 2017/0109312 A1* | 4/2017 | Voor | .................... | G06F 13/4282 |
| 2017/0147526 A1* | 5/2017 | Chen | .................... | G06F 13/4282 |
| 2017/0194756 A1* | 7/2017 | Chang | ................. | H01R 13/646 |

OTHER PUBLICATIONS

"Office Action of Taiwan Counterpart Application", dated Mar. 14, 2017, p. 1-p. 6.

* cited by examiner

MEMORY STORAGE DEVICE AND POWER MANAGEMENT METHOD THEREOF

CROSS-REFERENCE TO RELATED APPLICATION

This application claims the priority benefit of Taiwan application serial no. 105114852, filed on May 13, 2016. The entirety of the above-mentioned patent application is hereby incorporated by reference herein and made a part of this specification.

BACKGROUND

1. Technical Field

The present invention relates to a memory storage device and a power supply management method thereof.

DESCRIPTION OF RELATED ART

As portable electronic devices (i.e., smart phone) become widely used, functions thereof are almost as well as those of personal computers. Thus, demand of storing and browsing a large amount of video and audio data on portable electronic devices increases rapidly. As a result of the limited storage space in general portable electronic devices, the portable electronic devices with large storage space are expensive. Therefore, external storage devices have been become popular according to the demand. For example, a flash drive is an external storage device using NAND flash memory as storage media. Users can readily plug/unplug the flash drive to/from the portable electronic device to perform digital data transmission through a USB (Universal Serial Bus). After a conventional external storage device are connected to a portable electronic device, volume or connection manners thereof result in inconvenience for users with long usage time or who uses while moving. Thus, protection cases embedded with memory storage devices for portable electronic devices have been currently developed. In other words, when users place the portable electronic device in such protection case, the portable electronic device can be connected with the memory storage device embedded in the protection case, thus the storage space of the portable electronic device can be expanded. However, when expanding storage space by such manner, the connecting port of the portable electronic device is occupied by this memory storage device. Accordingly, the portable electronic device has to be taken out from the protection case when performing charging on the portable electronic device, thus causing inconvenience in use. As a result, it is one of the major subjects in the industry as how to charge the portable electronic device while the memory storage device is connected to the portable electronic device.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a memory storage device and a power management method thereof, which can receive power from an external power supply device to perform charging on the host device when the memory storage device is electrically connected with the host device, and when the memory storage device is receiving power and electrically connected with the host device and the external power supply device at the same time.

An exemplary embodiment of the present invention provides a memory storage device comprising a rewritable non-volatile memory module, a first connection interface unit, a second connection interface unit, a power management circuit and a memory control circuit unit. The first connection interface unit is configured to connect to the host device, wherein the first connection interface unit has a first power pin and a channel configuration pin. The second connection interface unit has a second power pin. The power management circuit is configured to receive a first power supply voltage from the host device via the first power pin of the first connection interface unit and supply an operation voltage to the the memory control circuit unit and the rewritable non-volatile memory module. The memory control circuit unit is coupled to the power management circuit, the rewritable non-volatile memory, the first connection interface unit and the second connection interface unit. When the external power supply device is electrically connected with the second connection interface unit, the power management circuit receives a second power supply voltage from the external power supply device via the second power pin of the second connection interface unit, and supplies an output voltage to the memory control circuit unit and the rewritable non-volatile memory module, wherein a second power supply voltage is supplied to the host device via the first power pin of the first connection interface unit. When the external power supply device is electrically disconnected with the second connection interface unit, the power management circuit receives a third power supply voltage via a channel configuration pin of the first connection interface unit, and supplies the output voltage to the memory control circuit unit and the rewritable non-volatile memory module. During receiving the third power supply voltage via the channel configuration pin of the first connection interface unit, when the first power supply voltage is detected on the first power pin of the first connection interface unit, the power management circuit receives a first power supply voltage via the first power pin of the first connection interface unit, and supplies the output voltage to the memory control circuit unit and the rewritable non-volatile memory module.

An exemplary embodiment of the present invention provides a power management method for a memory storage device, the memory storage device comprises a rewritable non-volatile memory module, a first connection interface unit, a second connection interface unit, a memory control circuit unit and a power management circuit. The power management method comprises: when the first connection interface unit is electrically connected with the host device, receiving a first power supply voltage from the host device via the first power pin of the first connection interface unit, and supplying an operation voltage to the memory control circuit unit and the rewritable non-volatile memory module. The power management method further comprises: when the external power supply device is electrically connected with the second connection interface unit, receiving a second power supply voltage from the external power supply device via the second power pin of the second connection interface unit, and supplying an output voltage to the memory control circuit unit and the rewritable non-volatile memory module, wherein the second power supply voltage is supplied to the host device via the first power pin of the first connection interface unit. The power management method also comprises: when the external power supply device is electrically disconnected with the second connection interface unit, the power management circuit receives a third power supply voltage via the channel configuration pin of the first connection interface unit, and supplies the output voltage to the memory control circuit unit and the rewritable non-volatile memory module. The power management method further comprises: during receiving the third power supply voltage via the channel configuration pin of the first connection interface unit, when the first power supply voltage is detected on the first power pin of the first connection interface unit, receiving the first power supply voltage via the first power pin of the first connection interface unit, and supplying the output voltage to the memory control circuit unit and the rewritable non-volatile memory module.

An exemplary embodiment of the present invention provides a memory storage device, which comprises a rewritable non-volatile memory module, a first connection interface unit, a second connection interface unit, a power management circuit and a memory control circuit unit. The first connection interface unit is configured to connect to the host device. The memory control circuit unit is coupled to the rewritable non-volatile memory, the first connection interface unit and the second connection interface unit. The power management circuit is coupled to the rewritable non-volatile memory module and the memory control circuit unit. When an external power supply device is electrically connected to the second connection interface unit, the power management circuit receives a second power supply voltage from the external power supply device via the second connection interface unit, and supplies an operation voltage to the memory control circuit unit and the rewritable non-volatile memory module. When the second connection interface unit is electrically disconnected with the external power supply device, the power management circuit receives a first power supply voltage from the host device via the first connection interface unit and supplies the operation voltage to the memory control circuit unit and the rewritable non-volatile memory module.

As above, the memory storage device and the power management method thereof in the exemplary embodiments of the present invention can connect the external power supply device to the memory storage device or remove it from the memory storage device, while steadily keep power supply of the memory storage device, when the memory device is connected to the host device.

In order to make the aforementioned and other features and advantages of the invention more comprehensible, embodiments accompanying figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
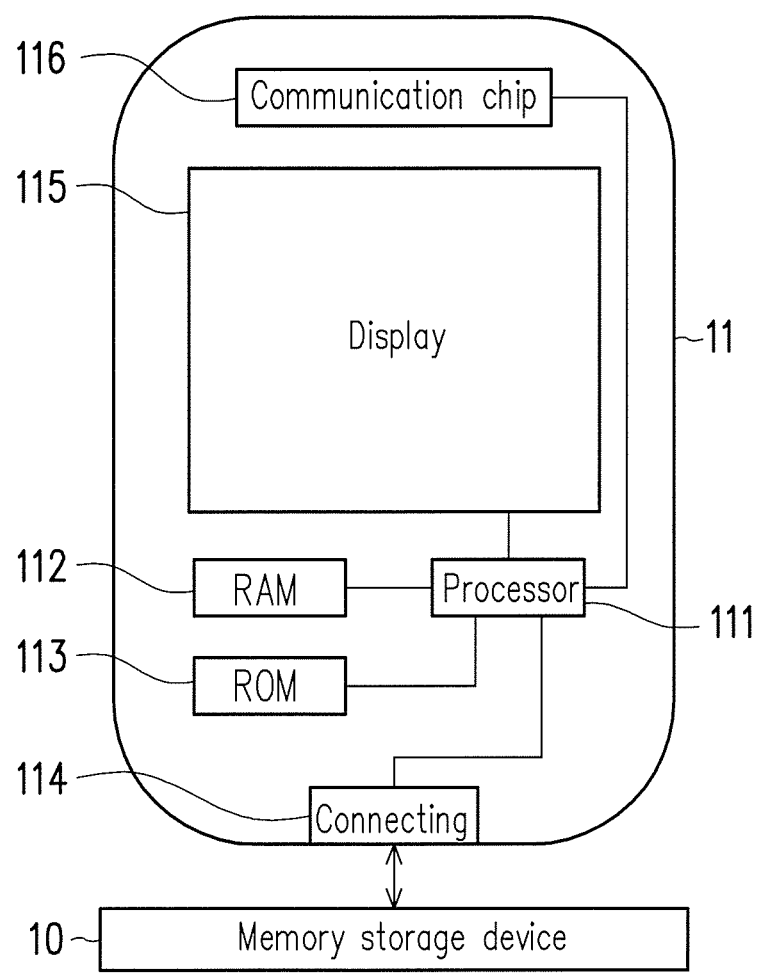
FIG. 1 is a schematic diagram illustrating a host device and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage apparatus (i.e., a memory storage system) includes a rewritable non-volatile memory module and a controller (i.e., a control circuit). The memory storage device is usually used together with a host device so that the host device can write data into or read data from the memory storage device.

FIG. 1 is a schematic diagram illustrating a host device and a memory storage device according to an exemplary embodiment.

Referring to FIG. 1, the host device 11 is a portable electronic device, such as a smart phone. The host device 11 generally includes a processor 111, a RAM (random access memory) 112, a ROM (read only memory) 113, a connecting port 114, a display 115 and a communication chip 116.

In this exemplary embodiment, the host device 11 is coupled to a memory storage device 10 via the connecting port 114. For example, the host device 11 can write data into the memory storage device 10 or read data from the memory storage device 10 via the connecting port 114.

Figure 2:
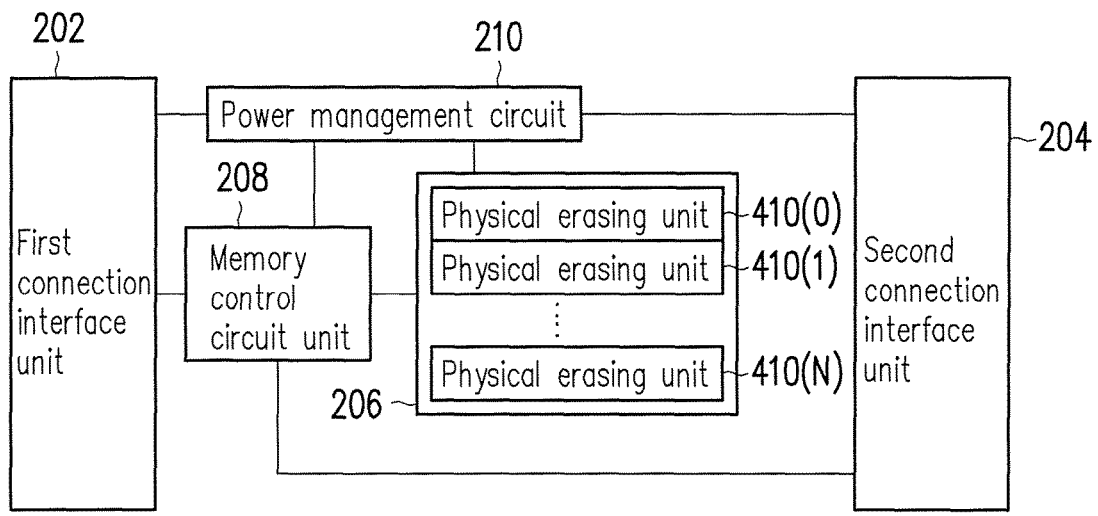
FIG. 2 is a schematic block diagram illustrating a memory device according to an exemplary embodiment.

FIG. 2 is a schematic block diagram illustrating a memory device according to an exemplary embodiment.

Referring to FIG. 2, the memory storage device 10 includes a first connection interface unit 202, a second connection interface unit 204, a rewritable non-volatile memory module 206, a memory control circuit unit 208 and a power management circuit 210.

The first connection interface unit 202 complies with a USB (Universal Serial Bus) standard, and is configured to connect to the host device 11. For example, the first connection interface unit 202 is a USB 3.1 Type-C male connection interface unit.

The second connection interface unit 204 also complies with a USB standard. For example, the second connection interface unit 204 is a USB 3.0 Type-A male connection interface unit. In this exemplary, the device supplying power (hereinafter, also known as an external power supply device) may be connected to the memory storage device 10 via the second connection interface unit 204. For example, this external power supply device may be a computer, a charger, a power bank, etc.

The rewritable non-volatile memory module 206 is coupled to the memory control circuit unit 208, and is configured to store the data written by the host device 11. The rewritable non-volatile memory storage module 206 has physical erasing units 410(0)~410(N). For example, the physical erasing units 410(0)~410(N) may belong to the same memory die or belong to different memory dies. Each physical erasing unit has a plurality of physical programming units, wherein the physical programming units of the same physical erasing unit may be written separately and erased simultaneously. Nevertheless, it should be understood that the present invention is not limited thereto. Each physical erasing unit may be composed by 64 physical programming units, 256 physical programming units or any amount of the physical programming units.

More specifically, the physical erasing unit is the minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundancy bit area is used to store system data (e.g., control information and error correcting code). In the present exemplary embodiment, each data bit area of the physical programming unit contains 8 physical access addresses, and the size of each physical access address is 512 byte. However, in other exemplary embodiments, the data bit area may also include more or less of the physical access addresses, and the amount and the size of the physical access addresses are not limited in the present invention. For example, in one exemplary embodiment, the physical erasing unit is a physical block, and the physical programming unit is a physical page or a physical sector, but the invention is not limited thereto.

In the present exemplary embodiment, the rewritable non-volatile memory module 206 is a SLC (Single Level Cell) NAND flash memory module (i.e., a flash memory module capable of storing one data bit in one memory cell). However, the present invention is not limited thereto. The rewritable non-volatile memory module 206 may also be a MLC (Multi Level Cell) NAND flash memory module (i.e., a flash memory module capable of storing two data bits in one memory cell), a TLC (Trinary Level Cell) NAND flash memory module (i.e., a flash memory module capable of storing three data bits in one memory cell) or any memory module having the same features.

The memory control circuit unit 208 is configured to execute a plurality of logic gates or control instructions which are implemented in form of hardware or firmware, so as to perform operations of writing, reading or erasing data in the rewritable non-volatile memory storage module 206 according to the commands issued by the host device 11.

The power management circuit 210 is coupled to the memory management circuit 302 and is configured to control the power of the memory storage device 10.

For example, in an exemplary embodiment, when the memory storage device 10 is electrically connected to the host device 11 via the first connection interface unit 202, the power management circuit 210 may receive a power supply voltage (hereinafter, also known as a first power supply voltage) via the first connection interface unit 202, and supply an operation voltage to the rewritable non-volatile memory module 206 and the memory control circuit unit 208 according to this first power supply voltage, in order to initialize the memory control circuit unit 208 and perform a memory access operation. Meanwhile (i.e., when the memory storage device 10 is electrically connected to the host device 11), when the external power supply device is electrically connected to the memory storage device 10 via the second connection interface unit 204, the power management circuit 210 may receive a power supply voltage (hereinafter, also known as a second power supply voltage) via the second connection interface unit 204 instead, and supply the operation voltage to the rewritable non-volatile memory module 206 and the memory control circuit unit 208 according to this second power supply voltage. At the same time, the second power supply voltage may be supplied to the host device 11 via the first connection interface unit 202.

More specifically, when the memory storage device 10 is electrically connected to the host device 11 via the first connection interface unit 202, the host device 11 can negotiate with the memory storage device 10 to confirm each other's roles according to a USB protocol. After negotiating and confirming the host device 11 as a master device and the memory storage device 10 as a slave device, the power management circuit 210 may receive power from the host device 11 via the power pin of the first connection interface unit 202 (hereinafter, also known as a first power pin) according to the USB protocol, in order to turn on the memory storage device 10, so that the host device 11 may access the memory storage device 10. In the case that the host device 11 is the master device and the memory storage device 10 is the slave device, when the external power supply device is electrically connected to the memory storage device 10 via the second connection interface unit 204, the power management circuit 210 transmits a mode switching request to the host device 11, in order to request the host device 11 to switch its role to the slave device, and receive power from the external power supply device via the power pin of the second connection interface unit 204 (hereinafter, also known as a second power pin) according to the USB protocol. At the same time, the power supplied by the external power supply device is input to the host device 11 via the power pin of the first connection interface unit 202, so that the host device 11 can perform charging. That is, when the external power supply device is not electrically disconnected to the memory storage device 10, the host device 11 is in a power supplying mode, to supply power to the memory storage device 10. In addition, when the external power supply device is electrically connected to the memory storage device 10, the host device 11 is in a power receiving mode, to perform an operation of charging.

Particularly, in the present exemplary embodiment, when the external power supply device electrically connected to the memory storage device 10 via the second connection interface unit 204 is removed (i.e., the external power supply device is electrically disconnected with the memory storage device 10), the power management circuit 210 receives a power supply voltage via a channel configuration pin of the first connection interface unit 202 (hereinafter, also known as a third power supply voltage) as a standby power, and supply an operation voltage to the rewritable non-volatile memory module 206 and the memory control circuit unit 208 according to this third power supply voltage, and the power management circuit 210 transmits a mode switching request to the host device 11, in order to request the host device 11 to switch its role to the master device. After the host device 11 switching to the master device again, the power management circuit 210 receives the first power supply voltage from the host device 11 via the power pin of the first connection interface unit 202 according to the USB protocol, and supply an operation voltage to the rewritable non-volatile memory module 206 and the memory control circuit unit 208 according to this first power supply voltage, in order to keep maintaining operation.

Figure 3:
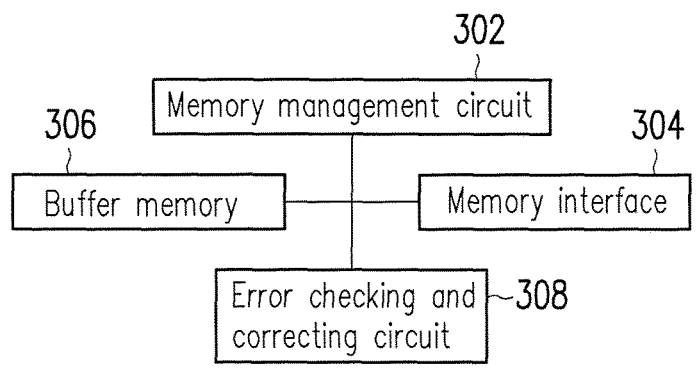
FIG. 3 is a schematic block diagram illustrating a memory control circuit unit according to an exemplary embodiment.

FIG. 3 is a schematic block diagram illustrating a memory control circuit unit according to an exemplary embodiment.

Referring to FIG. 3, the memory control circuit unit 208 includes a memory management circuit 302, a memory interface 304, a buffer memory 306 and an error checking and correcting circuit 308.

The memory management circuit 302 is configured to control overall operations of the memory control circuit unit 208. More specifically, the memory management circuit 302 has multiple control instructions, and these control instructions are executed to perform operations such as writing, reading, erasing, etc. when the memory storage device 10 is in operation.

In this exemplary embodiment, the control instructions of the memory management circuit 302 are implemented in form of firmware. For example, the memory management circuit 302 has a micro-processor unit (not shown) and a ROM (not shown), and these control instructions are programmed to this ROM. When the memory storage device 10 is in operation, these control instructions are executed by the micro-processor unit to perform operations such as writing, reading, erasing, etc.

Figure 4:
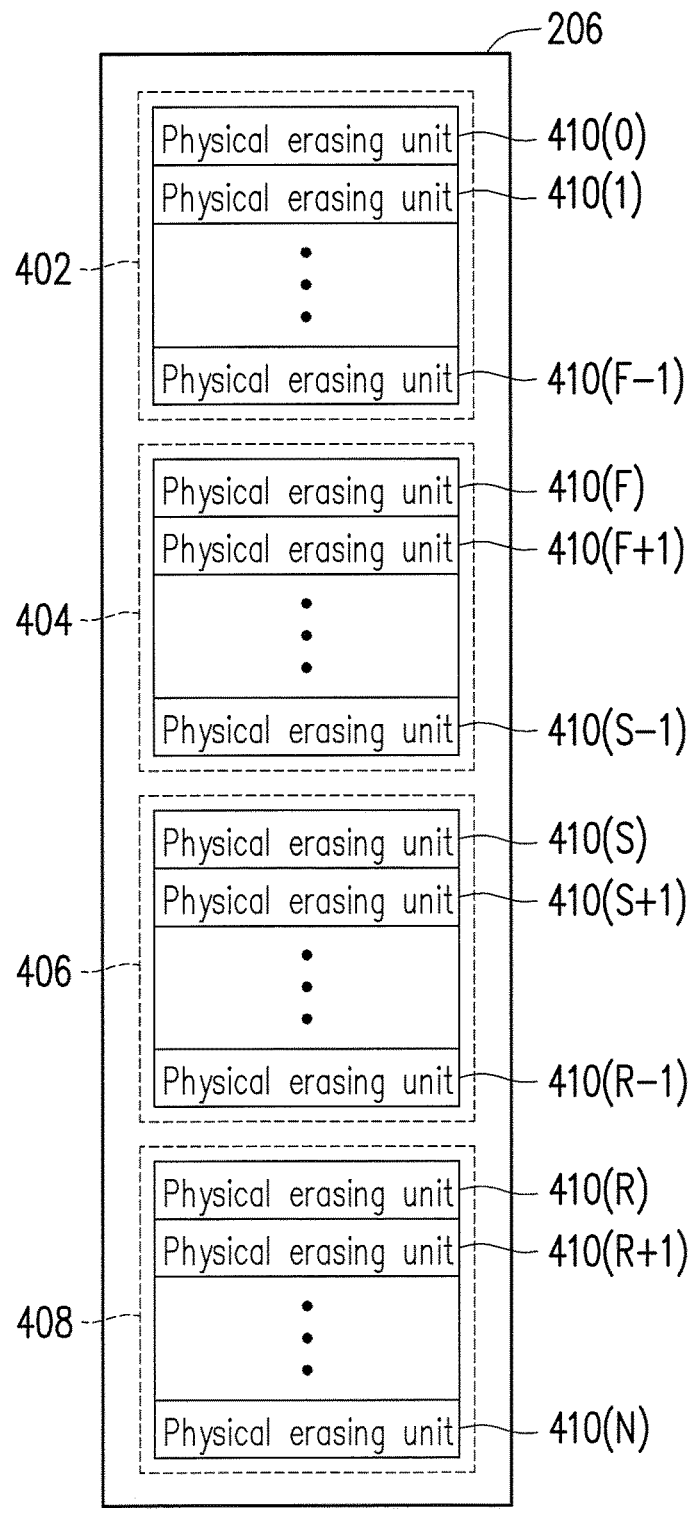
FIG. 4 and FIG. 5 are schematic diagrams illustrating a management of the physical erasing units according to an exemplary embodiment.
Figure 5:
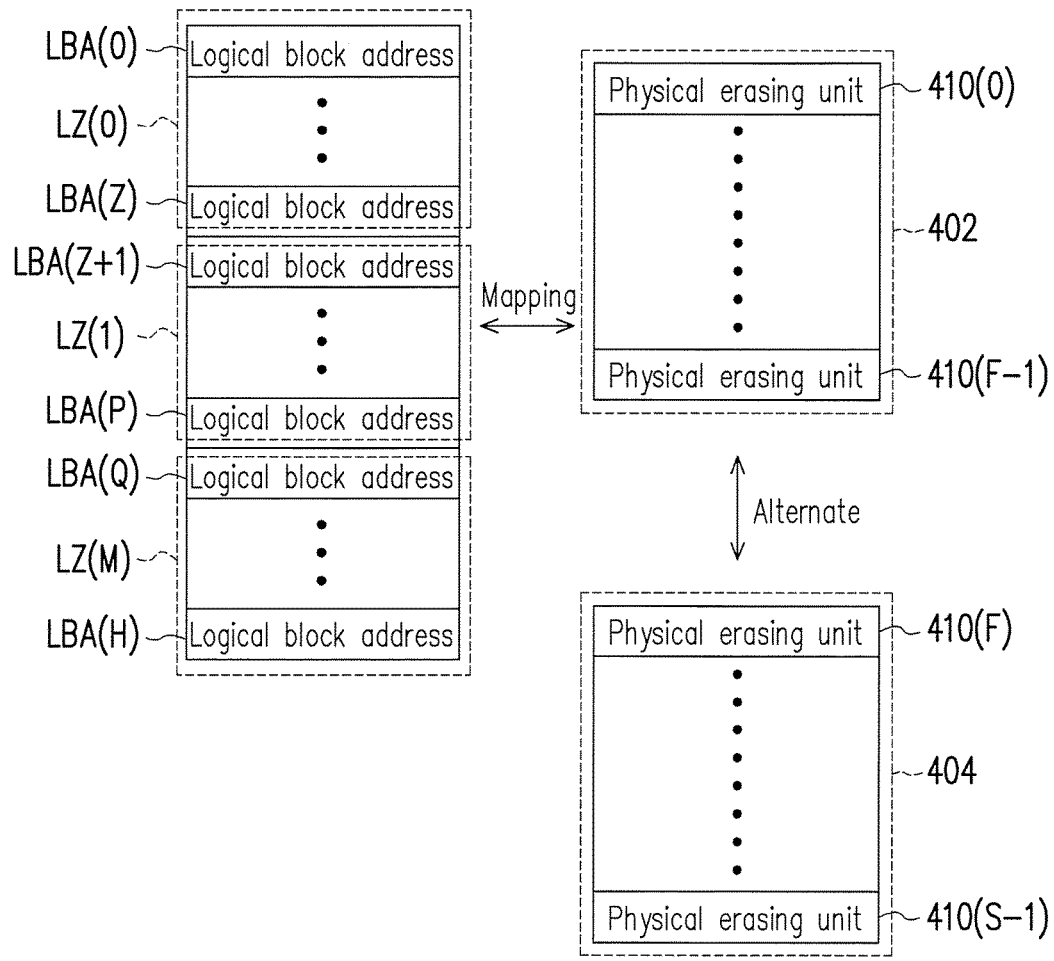

FIG. 4 and FIG. 5 are schematic diagrams illustrating a management of the physical erasing units according to an exemplary embodiment.

It should be understood that terms, such as "get", "group", "divide", "associate" and so forth, are logical concepts which describe operations in the physical erasing units of the rewritable non-volatiles memory module 206. That is, the physical erasing units of the rewritable non-volatile memory module are logically operated, but actual positions of the physical units of the rewritable non-volatile memory module are not changed.

Referring to FIG. 4, the memory control circuit unit 208 (or the memory management circuit 302) may logically group the physical erasing units 410(0)~410(N) into a data area 402, a spare area 404, a system area 406 and a replacement area 408.

The physical erasing units logically belonging to the data area 402 and the spare area 404 are configured to store data from the host device 11. More specifically, the physical erasing units of the data area 402 are regarded as the physical erasing units stored with the data, whereas the physical erasing units of the spare area 404 are configured to replace the physical erasing units of the data area 402. In other words, when the write command and the data to be written are received by the host device 11, the memory control circuit unit 208 (or the memory management circuit 302) gets the physical erasing units from the spare area 404 to write the data, in order to replace the physical erasing units in the data area 402.

The physical erasing units logically belonging to the system area 406 are configured to record system data. For example, the system data includes information related to manufacturer and model of the rewritable non-volatile memory module, the number of physical erasing units of the rewritable non-volatile memory module, the number of the physical programming units in each physical erasing unit, and so forth.

The physical erasing units logically belonging to the replacement area 408 are used in a bad physical erasing unit replacement operation for replacing damaged physical erasing units. More specifically, if normal physical erasing units are still available in the replacement area 408 and the physical erasing units of the data area 402 are damaged, the memory control circuit unit 208 (or the memory management circuit 302) gets the normal physical erasing units from the replacement area 408 for replacing the damaged physical erasing units.

Particularly, the numbers of the physical erasing units in the data area 402, the spare area 404, the system area 406 and the replacement area 408 may be different from one another according to the different memory specifications. In addition, it should be understood that, during operations of the memory storage device 10, grouping relations of the physical erasing units for associating with the data area 402, the spare area 404, the system area 406, and the replacement area 408 may be dynamically changed. For example, when the damaged physical erasing units in the spare area 404 are replaced by the physical erasing units in the replacement area 408, the physical erasing units originally from the replacement area 408 are associated with the spare area 404.

Referring to FIG. 5, the memory control circuit unit 208 (or the memory management circuit 302) is configured with logical block addresses LBA(0)~LBA(H) for mapping the physical erasing units of the data area 402, wherein each of the logical block addresses has a plurality of logical addresses for mapping to the corresponding physical programming units of the physical erasing units. Moreover, when the host device 11 is to write data to the logical addresses or update data stored in the logical addresses, the memory control circuit unit 208 (or the memory management circuit 302) gets a physical erasing unit from the spare area 404 as an active physical erasing unit for writing data, so as to alternate the physical erasing units of the data area 402. In addition, when the physical erasing unit as the active physical erasing unit is fully written, the memory control circuit unit 208 (or the memory management circuit 302) gets empty physical erasing units from the spare area 404 as active physical erasing units to continue writing the updated data corresponding to the write command from the host device 11. Furthermore, when the number of the physical erasing units available in the spare area 404 is smaller than a predetermined value, the memory control circuit unit 208 (or the memory management circuit 302) executes an operation of garbage collection (also referred to as an operation of valid data merge) to organize valid data in the data area 402, so as to re-associate the physical erasing units not stored with the valid data in the data area 402 to the spare area 404.

To identify in which physical erasing units the data of each logical address is stored, in the present exemplary embodiment, the memory control circuit unit 208 (or the memory management circuit 302) records the mapping relations between the logical addresses and the physical programming units. For example, in the present exemplary embodiment, the memory control circuit unit 208 (or the memory management circuit 302) stores a logical address-physical address mapping table in the rewritable non-volatile memory module 206 to record the physical programming unit mapped to each logical address. When data is to be maintained, the memory control circuit unit 208 (or the memory management circuit 302) loads the logical address-physical address mapping table to the buffer memory 306 for maintenance, and write or read data according to the logical address-physical address mapping table.

It should be mentioned that, due to limited capacity, the buffer memory 306 is unable to store the mapping table recording the mapping relations of all logical addresses. Therefore, in the present exemplary embodiment, the memory control circuit unit 208 (or the memory management circuit 302) groups the logical block addresses LBA(0)~LBA(H) into a plurality of logical zones LZ(0)~LZ(M), and allocate one logical address-physical address mapping table to each logical zone. Particularly, when the memory control circuit unit 208 (or the memory management circuit 302) is to update the mapping of a certain logical block address, the logical address-physical address mapping table corresponding to the logical zone of the logical block address is loaded to the buffer memory 306 to be updated.

In another exemplary embodiment, the control instructions of the memory management unit 302 may also be stored in a specific area (e.g., the system area in a memory module exclusively used for storing system data) of the rewritable non-volatile memory module 206 as a form of program codes. In addition, the memory management circuit 302 has a micro-processor unit (not shown), a ROM (not shown) and a RAM (not shown). Particularly, this ROM includes a boot code, and when the memory control circuit unit 208 is enabled, the micro-processor unit first executes the boot code segment to load the control instructions stored in the rewritable non-volatile memory module 206 to the RAM of the memory management circuit 302. Hereafter, the micro-processor unit operates these control instructions, in order to perform operations of data writing, reading, erasing, etc.

Furthermore, in another exemplary embodiment, the control instructions of the memory management circuit 302 may also be implemented in a hardware than. For example, the memory management circuit 302 includes a micro-controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro-controller. Specifically, the memory cell management circuit is configured to manage the physical erasing units of the rewritable non-volatile memory module 206. The memory writing circuit is configured to issue a write command to the rewritable non-volatile memory module 206 for writing data to the rewritable non-volatile memory module 206. The memory reading circuit is configured to issue a read command to the rewritable non-volatile memory module 206 for reading data from the rewritable non-volatile memory module 206. The memory erasing circuit is configured to issue an erase command to the rewritable non-volatile memory module 206 for erasing data from the rewritable non-volatile memory module 206. The data processing circuit is configured to process data to be written to the rewritable non-volatile memory module 206 and data read from the rewritable non-volatile memory module 206.

Referring to FIG. 3, the memory interface 304 is coupled to the memory management circuit 302, and is configured to access the rewritable non-volatile memory module 206. That is, the data to be written to the non-volatile memory 206 is converted to a format acceptable to the non-volatile memory 206 via the memory interface 304.

The buffer memory 306 is coupled to the memory management circuit 302, and is configured to temporarily store the data and the commands from the host device 11 or the data from the rewritable non-volatile memory module 206.

The error checking and correcting circuit 308 is coupled to the memory management circuit 302 and is configured to execute an error checking and correcting procedure to ensure correctness of the data. For example, when the memory management circuit 302 receives a write command from the host device 11, the error checking and correcting circuit 308 generates an error checking and correcting code (ECC Code) for the data corresponding to the write command, and the memory management circuit 302 writes the data corresponding to the write command and the corresponding error checking and correcting code to the rewritable non-volatile memory module 206. Afterwards, when reading the data from the rewritable non-volatile memory module 206, the memory management circuit 302 simultaneously reads the error checking and correcting code corresponding to the data, and the error checking and correcting circuit 308 executes the error checking and correcting procedure on the read data according to the error checking and correcting code.

Figure 6:
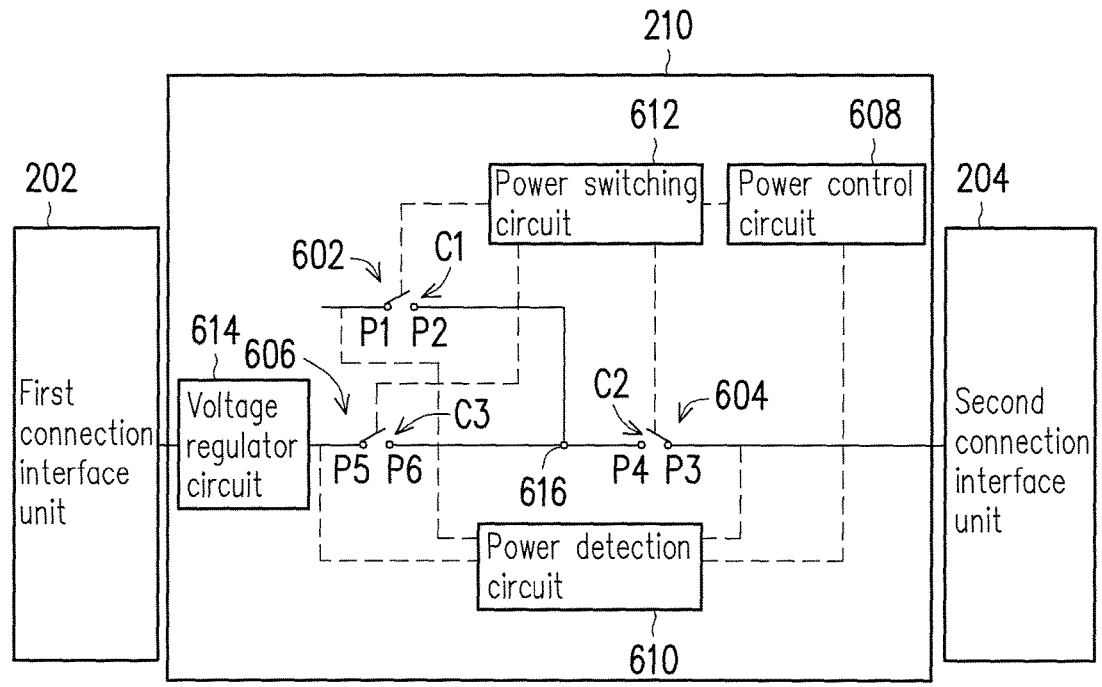
FIG. 6 is a schematic block diagram illustrating a power management circuit according to an exemplary embodiment of the present invention.

FIG. 6 is a schematic block diagram illustrating a power management circuit according to an exemplary embodiment.

Referring to FIG. 6, a power management circuit 210 includes a first switch circuit 602, a second switch circuit 604, a third switch circuit 606, a power control circuit 608, a power detection circuit 610, a power switching circuit 612, a voltage regulator circuit 614 and a power input terminal 616.

The first switch circuit 602 includes a first terminal P1, a second terminal P2 and a control terminal C1. The first terminal P1 is coupled to the power pin of the first connection interface unit 202, the second terminal P2 is coupled to the power input terminal 616, the control terminal C1 is coupled to the power switching circuit 612.

The second switch circuit 604 includes a first terminal P3, a second terminal P4 and a control terminal C2. The first terminal P3 is coupled to the power pin of the second connection interface unit 204, the second terminal P4 is coupled to the power input terminal 616, the control terminal C2 is coupled to the power switching circuit 612.

The third switch circuit 606 includes a first terminal P5, a second terminal P6 and a control terminal C3. The first terminal P5 is coupled to the power pin of the first connection interface unit 202, the second terminal P6 is coupled to the power input terminal 616, the control terminal C3 is coupled to the power switching circuit 612.

When the memory storage device 10 is not connected to the host device 11, the first switch circuit 602, the second switch circuit 604 and the third switch circuit 606 are turned off in an initial state, that is, the first switch circuit 602, the second switch circuit 604 and the third switch circuit 606 are not conducted.

The power control circuit 608 is coupled to the power detection circuit 610 and the power switching circuit 612, and is configured to control the power switching circuit 612 according to the detection result of the power detection circuit 610, so as to turn on or turn off the first switch circuit 602, the second switch circuit 604 and the third switch circuit 606.

The power detection circuit 610 is configured to detect the voltages on the first terminal P1, the first terminal P3 and the first terminal P5, and transmit a detection signal to the power control circuit 608 according to the detection result.

The power control circuit 612 is configured to operate the control terminal C1, the control terminal C2 and the control terminal C3 according to the commands of the power switching circuit 608, in order to turn on or turn off the first switch circuit 602, the second switch circuit 604 and the third switch circuit 606.

The voltage regulator circuit 614 is configured to adjust the received voltage from the channel configuration pin of the first connection interface unit 202. For example, the power pin of the first connection interface unit 202 and the power pin of the second connection interface unit 204 receive voltage of 5 V as the operation voltage of the memory control circuit unit 204 and the rewritable non-volatile memory module 206. As described above, in the present exemplary embodiment, the power management circuit 210 uses the power received from the channel configuration pin of the first connection interface unit 202 as a standby power. For ensuring the voltage received from the channel configuration pin of the first connection interface unit 202 can be steadily served as the operation voltage supplied to the memory control circuit unit 204 and the rewritable non-volatile memory module 206, the voltage regulator circuit 614 adjusts the voltage received from the channel configuration pin of the first connection interface unit 202 to 5 V.

The power input terminal 616 is coupled to the memory control circuit unit 204 and the rewritable non-volatile memory module 206, in order to supply the operation voltage to the memory control circuit unit 204 and the rewritable non-volatile memory module 206.

Figure 7:
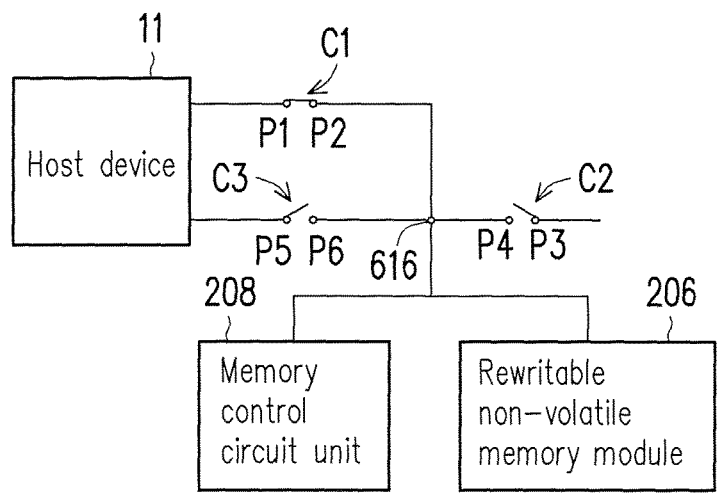
FIG. 7 is a schematic diagram illustrating the operation of the power management circuit according to an example.

FIG. 7 is a schematic diagram illustrating the operation of the power management circuit according to an example.

Referring to FIG. 7, when users connect the first connection interface unit 202 of the memory storage device 10 to a connecting port of the host device 11, the host device 11 perform handshaking with the memory storage device 10 according to the USB protocol, and confirm the host device 11 as the master device and the memory storage device 10 as the slave device. Accordingly, the power control circuit 608 transmits a control signal to the power switching circuit 612, and the power switching circuit 612 turns on the control terminal C1 of the first switch circuit 602 according to this control signal, so as to conduct the first switch circuit 602. In this case, the host device 11 is in a host power supplying mode, wherein the power management circuit 210 receive a power supply voltage (hereinafter, also known as a first power supply voltage) via the power pin of the first connection interface unit 202, and thus supply the operation voltage to the memory control circuit unit 204 and the rewritable non-volatile memory module 206 via the power input terminal 616.

Figure 8:
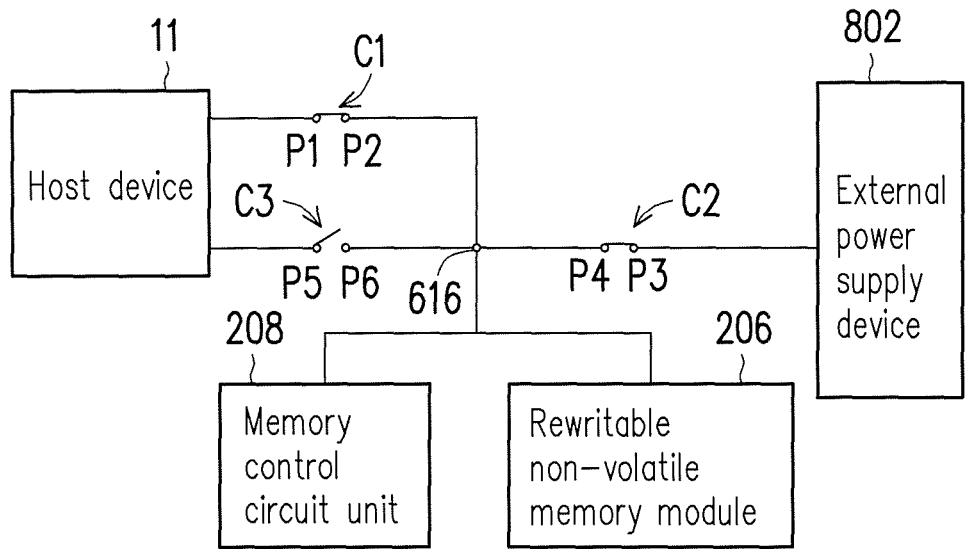
FIG. 8 is a schematic diagram illustrating the operation of the power management circuit according to another example.

FIG. 8 is a schematic diagram illustrating the operation of the power management circuit according to another example.

Referring to FIG. 8, in the host power supplying mode as shown in FIG. 7, when users connect the external power supply device 802 to the second connection interface unit 204 of the memory storage device 10, a power supply voltage received on the power pin of the second connection interface unit 204 (hereinafter, also known as a second power supply voltage) is detected by the power detection circuit 610, and the power detection circuit 610 transmits a detection signal (hereinafter, also known as a first detection signal) to the power control circuit 608. After receiving the first detection signal, the power control circuit 608 commands the power switching circuit 612 to turn off the control terminal C1 of the first switch circuit 602 (i.e., the first switch circuit is not conducted), and turn on the control terminal C2 of the second switch circuit 604 (i.e., the second switch circuit is conducted) according to this first detection signal. Afterward, the memory storage device 10 transmits a mode switching request (hereinafter, also known as a first mode switching request) according to the USB protocol, and when the role of the host device 11 is switched from the master device to the slave device, the power control circuit 608 transmits a control signal to the power switching circuit 612, and the power switching circuit 612 turns on the control terminal C1 of the first switch circuit 602 according to this control signal, so as to conduct the first switch circuit 602. In this case, the host device 11 is in a host power receiving mode, wherein the power management circuit 210 receives the second power supply voltage via the power pin of the second connection interface unit 204, and thus supply the operation voltage to the memory control circuit unit 204 and the rewritable non-volatile memory module 206 via the power input terminal 616. Particularly, the second power supply voltage is transmitted to the host device 11 via the power pin of the first connection interface unit 202, so as to charge the host device 11.

Figure 9:
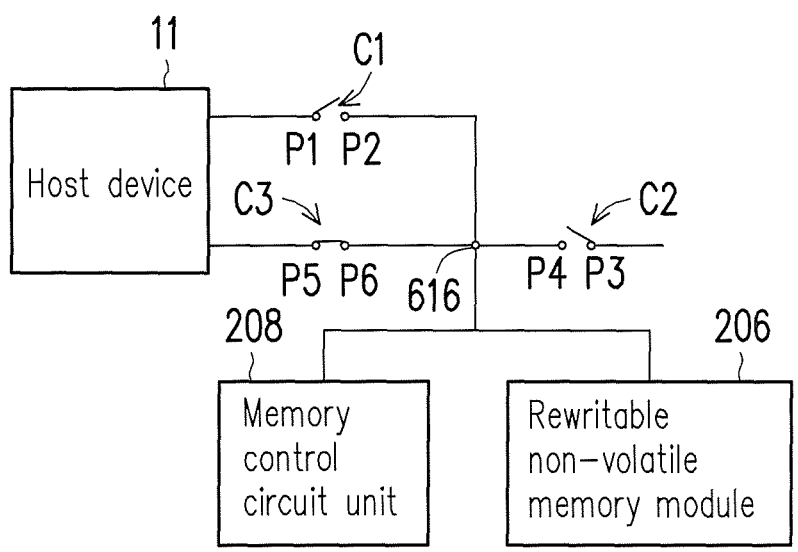
FIG. 9 is a schematic diagram illustrating the operation of the power management circuit according to another example.

FIG. 9 is a schematic diagram illustrating the operation of the power management circuit according to another example.

Referring to FIG. 9, in the host power receiving mode as shown in FIG. 8, when users remove the external power supply device 802 (i.e., the external power supply device 802 and the second connection interface unit 204 of the memory storage device 10 is electrically disconnected), the second power supply voltage on the power pin of the second connection interface unit 204 is not detected by the power detection circuit 610, and the power detection circuit 610 transmits a detection signal (hereinafter, also known as a second detection signal) to the power control circuit 608. After receiving the second detection signal, the power control circuit 608 command the power switching circuit 612 to turn off the control terminal C2 of the second switch circuit 604 (i.e., the second switch circuit is not conducted), and turn on the control terminal C3 of the third switch circuit 606 (i.e., the third switch circuit is conducted) according to this second detection signal. In this case, the memory storage device 10 is in a standby power supplying mode, wherein the power management circuit 210 receives a power supply voltage via the channel configuration pin of the first connection interface unit 202 (hereinafter, also known as a third power supply voltage), and thus supply the operation voltage to the memory control circuit unit 204 and the rewritable non-volatile memory module 206 via the power input terminal 616.

Afterward, the memory storage device 10 transmits a mode switching request (hereinafter, also known as a second mode switching request) according to the USB protocol, and when the role of the host device 11 is switched from the slave device to the master device, the power control circuit 608 transmits a control signal to the power switching circuit 612, and the power switching circuit 612 turns off the control terminal C3 of the third switch circuit 606 (i.e., the third switch circuit is not conducted), and turn on the control terminal C1 of the first switch circuit 602 (i.e., the first switch circuit is conducted) according to this control signal, thus returning to the host power supplying mode as shown in FIG. 7. Generally speaking, during mode switching, the memory storage device 10 and the host device 11 keep transmitting and receiving protocol commands to/from each other, it takes about 55 ms to complete role switching.

Based on the description above, in the example of using the memory storage device 10 to expand the host device 11, users can connect the external power supply device 802 to the memory storage device 10 directly to charge the host device 11, and when the external power supply device 802 is disconnected, the memory storage device 10 can return to a state that the host device 11 supplies power.

Figure 10:
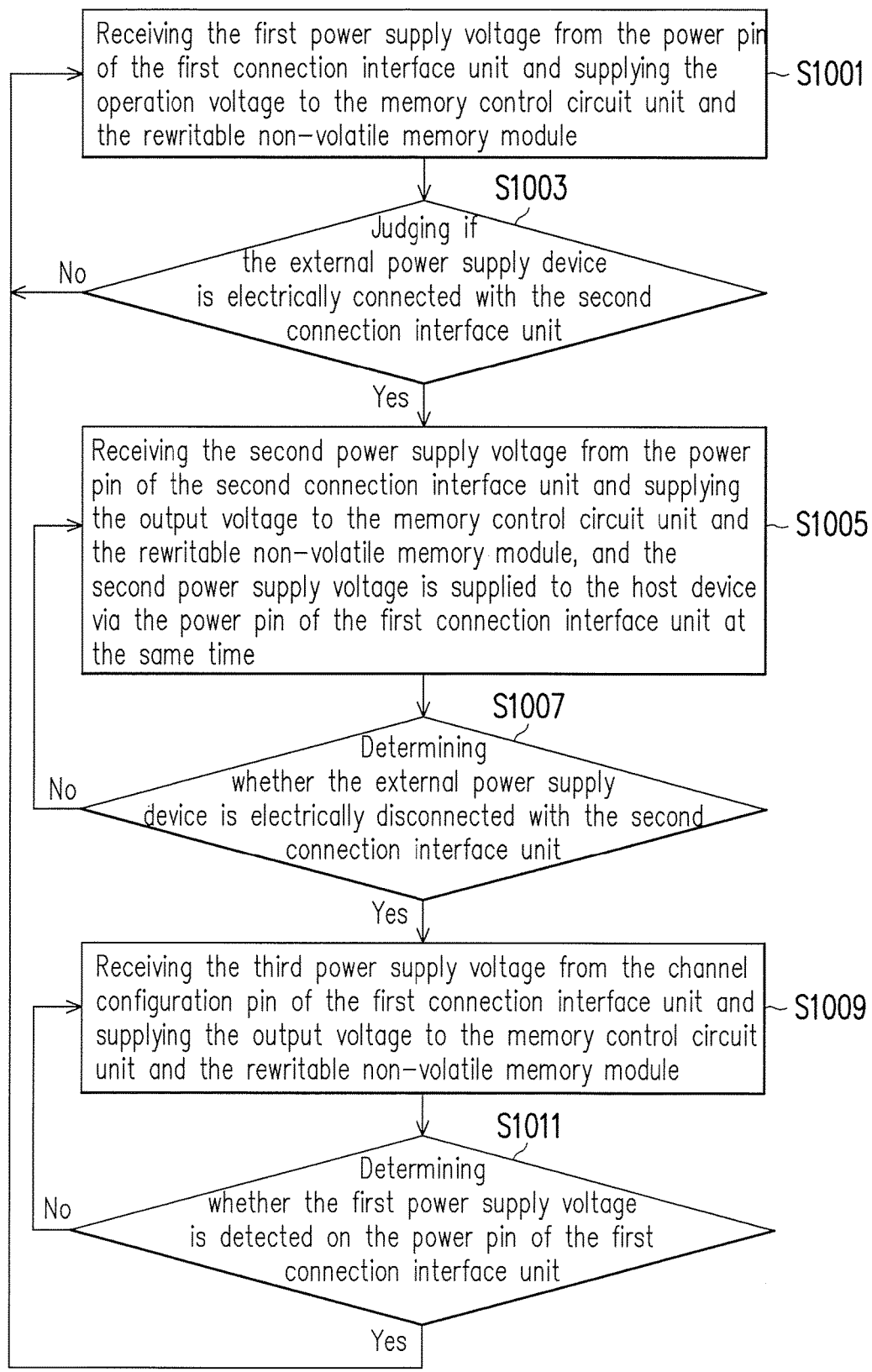
FIG. 10 is a flow chart illustrating a power management method according to an exemplary embodiment.

FIG. 10 is a flow chart illustrating a power management method according to an exemplary embodiment.

Referring to FIG. 10, when the first connection interface unit 202 is electrically connected with the host device 11, in step S1001, the power management circuit 210 receives the first power supply voltage from the host device 11 via the power pin of the first connection interface unit 202, and supplies the operation voltage to the memory control circuit unit 208 and the rewritable non-volatile memory module 206. In other words, the memory storage device 10 is in the host power supplying mode that the host device 11 serves as a power source in step S1001, and the example of the host power supplying mode has been described accompanied with FIG. 7 in detail as above, and is not going to be described again herein.

In step S1003, the power management circuit 210 determines whether the external power supply device 802 is electrically connected with the second connection interface unit 204. The example of determining whether the external power supply device 802 is electrically connected with the second connection interface unit 204 has been described accompanied with FIG. 8 in detail as above, and is not going to be described again herein.

If the external power supply device 802 and the second connection interface unit 204 are not electrically connected, then step S1001 is kept executed.

If the external power supply device 802 is electrically connected with the second connection interface unit 204, in step S1005, the power management circuit 210 receives the second power supply voltage from the external power supply device 802 via the power pin of the second connection interface unit 204, and supplies the output voltage to the memory control circuit unit 208 and the rewritable non-volatile memory module 206, and the second power supply voltage is supplied to the host device 11 via the power pin of the first connection interface unit 202 at the same time. In other words, the memory storage device 10 is in the host power receiving mode in step S1005, and the example of the host power receiving mode has been described accompanied with FIG. 8 in detail as above, and is not going to be described again herein.

Afterward, in step S1007, the power management circuit 210 determines whether the external power supply device 802 is electrically disconnected with the second connection interface unit 204.

If the external power supply device 802 and the second connection interface unit 204 are not electrically disconnected, then step S1005 is kept executed.

If the external power supply device 802 is electrically disconnected with the second connection interface unit 204, in step S1009, the power management circuit 210 receives the third power supply voltage via the channel configuration pin of the first connection interface unit 202, and supplies the output voltage to the memory control circuit unit 208 and the rewritable non-volatile memory module 206. In other words, the memory storage device 10 is in the standby power supplying mode in step S1009, and the example of the standby power supplying mode has been described accompanied with FIG. 9 in detail as above, and is not going to be described again herein.

Then, in step S1011, the power management circuit 210 determines whether the first power supply voltage is detected on the power pin of the first connection interface unit 202.

If the first power supply voltage is not detected on the power pin of the first connection interface unit 202, step S1009 is kept executed.

If the first power supply voltage is detected on the power pin of the first connection interface unit 202, step S1001 is kept executed. In other words, the memory storage device 10 returns to the host power supplying mode.

As above, the memory storage device and the power management method in the exemplary embodiments of the present invention can charge the host device by connecting the external power supply device to the memory storage device when the connecting port of the host device is occupied by the memory storage device. For example, when users using the protection case embedded with the memory storage device to protect the host device and expand its storage space, users can charge the host device without removing the protection case, thus the inconvenience is greatly alleviated. The previously described exemplary embodiments of the present invention have the advantages aforementioned, wherein the advantages aforementioned not required in all versions of the invention.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A memory storage device comprising:
   a rewritable non-volatile memory module;
   a first connection interface unit configured to connect to a host device, wherein the first connection interface unit having a first power pin and a channel configuration pin;
   a second connection interface unit having a second power pin;
   a power management circuit configured to receive a first power supply voltage from the host device via the first power pin of the first connection interface unit, and supply an operation voltage to the memory control circuit unit and the rewritable non-volatile memory module; and
   a memory control circuit unit, coupled to the power management circuit, the rewritable non-volatile memory, the first connection interface unit and the second connection interface unit,
   if an external power supply device is electrically connected with the second connection interface unit, the power management circuit receives a second power supply voltage from the external power supply device via the second power pin of the second connection interface unit, and supplies the output voltage to the memory control circuit unit and the rewritable non-volatile memory module, wherein the second power supply voltage is supplied to the host device via the first power pin of the first connection interface unit;

if the external power supply device is electrically disconnected with the second connection interface unit, the power management circuit receives a third power supply voltage via the channel configuration pin of the first connection interface unit, and supplies the output voltage to the memory control circuit unit and the rewritable non-volatile memory module;

during receiving the third power supply voltage via the channel configuration pin of the first connection interface unit, if the first power supply voltage is detected on the first power pin of the first connection interface unit, the power management circuit receives the first power supply voltage via the first power pin of the first connection interface unit, and supplies the output voltage to the memory control circuit unit and the rewritable non-volatile memory module.

2. The memory storage device as claimed in claim 1, wherein if the external power supply device is electrically connected with the second connection interface unit, the power management circuit transmits a first mode switching request to the host device, wherein the host device is switched to a power receiving mode according to the first mode switching request, wherein if the external power supply device is electrically disconnected with the second connection interface unit, the power management circuit transmits a second mode switching request to the host device, wherein the host device is switched to a power supplying mode according to the second mode switching request.

3. The memory storage device as claimed in claim 1, wherein the power management circuit comprising a power input terminal, a first switch circuit, a second switch circuit and a third switch circuit, a first terminal of the first switch circuit is coupled to the power input terminal, and a second terminal of the first switch circuit is coupled to the first power pin of the first connection interface unit, a first terminal of the second switch circuit is coupled to the power input terminal, and a second terminal of the second switch circuit is coupled to the second power pin of the second connection interface unit, a first terminal of the third switch circuit is coupled to the power input terminal, and a second terminal of the third switch circuit is coupled to the channel configuration pin of the first connection interface unit, the memory control circuit unit and the rewritable non-volatile memory module are coupled to the power input terminal.

4. The memory storage device as claimed in claim 3, wherein if the second power supply voltage is detected on the second power pin of the second connection interface unit, the power management circuit turns on the second switch circuit to receive the second power supply voltage from the external power supply device via the second power pin of the second connection interface unit, and supply the output voltage to the memory control circuit unit and the rewritable non-volatile memory module via the power output terminal.

5. The memory storage device as claimed in claim 4, wherein if the electrical disconnection between the second connection interface unit and the external power supply device is detected, the power management circuit turns off the second switch circuit, and turns on the third switch circuit to receive the third power supply voltage via the channel configuration pin of the first connection interface unit, and supply the output voltage to the memory control circuit unit and the rewritable non-volatile memory module via the power output terminal.

6. The memory storage device as claimed in claim 5, wherein if the first power supply voltage is detected on the first power pin of the first connection interface unit, the power management circuit turns off the third switch, and turns on the first switch circuit to receive the first power supply voltage via the first power pin of the first connection interface unit, and supply the output voltage to the memory control circuit unit and the rewritable non-volatile memory module via the power output terminal.

7. The memory storage device as claimed in claim 6, wherein the power management circuit further comprising:

a power control circuit, a power detection circuit, coupled to the power control circuit and coupled to the second terminal of the first switch circuit, the second terminal of the second switch circuit and the second terminal of the third switch circuit, a power switching circuit, coupled to the power control circuit and coupled to a control terminal of the first switch circuit, a control terminal of the second switch circuit and a control terminal of the third switch circuit, wherein if the second power supply voltage is detected by the power detection circuit, the power detection circuit transmits a first detection signal to the power control circuit, and the power control circuit controls the power switching circuit to turn on the second switch circuit according to the first detection signal, wherein if the second power supply voltage is not detected by the power detection circuit, the power detection circuit transmits a second detection signal to the power control circuit, and the power control circuit controls the power switching circuit to turn off the second switch circuit and turn on the third switch circuit according to the second detection signal, wherein if the first power supply voltage is detected by the power detection circuit, the power detection circuit transmits a third detection signal to the power control circuit, and the power control circuit controls the power switching circuit to turn off the third switch circuit and turn on the first switch circuit according to the third detection signal.

8. The memory storage device as claimed in claim 7, wherein the power management circuit further comprising:

a voltage regulator circuit, coupled to the third switch and configured to adjust the third power supply voltage received via the channel configuration pin of the first connection interface unit.

9. A power management method for a memory storage device comprising a rewritable non-volatile memory module, a first connection interface unit, a second connection interface unit, a memory control circuit unit and a power management circuit, the power management method comprising:

if the first connection interface unit is electrically connected with a host device, receiving a first power supply voltage from the host device via a first power pin of the first connection interface unit and supplying an operation voltage to the memory control circuit unit and the rewritable non-volatile memory module;

if an external power supply device is electrically connected with the second connection interface unit, receiving a second power supply voltage from the external power supply device via a second power pin of the second connection interface unit, and supplying the output voltage to the memory control circuit unit and the rewritable non-volatile memory module, wherein the second power supply voltage is supplied to the host device via the first power pin of the first connection interface unit;

if the external power supply device is electrically disconnected with the second connection interface unit, the power management circuit receives a third power supply voltage via a channel configuration pin of the first connection interface unit, and supplies the output voltage to the memory control circuit unit and the rewritable non-volatile memory module; and during receiving the third power supply voltage via the channel configuration pin of the first connection interface unit, when the first power supply voltage is detected on the first power pin of the first connection interface unit, receiving the first power supply voltage via the first power pin of the first connection interface unit, and supplying the output voltage to the memory control circuit unit and the rewritable non-volatile memory module.

10. The power management method as claimed in claim 9 further comprising:

if the external power supply device is electrically connected with the second connection interface unit, transmitting a first mode switching request to the host device, wherein the host device is switched to a power receiving mode according to the first mode switching request, if the external power supply device is electrically disconnected with the second connection interface unit, transmitting a second mode switching request to the host device, wherein the host device is switched to a power supplying mode according to the second mode switching request.

11. The power management method as claimed in claim 9, wherein the power management circuit comprising a power input terminal, a first switch circuit, a second switch circuit and a third switch circuit, a first terminal of the first switch circuit is coupled to the power input terminal, and a second terminal of the first switch circuit is coupled to the first power pin of the first connection interface unit, a first terminal of the second switch circuit is coupled to the power input terminal, and a second terminal of the second switch circuit is coupled to the second power pin of the second connection interface unit, a first terminal of the third switch circuit is coupled to the power input terminal, and a second terminal of the third switch circuit is coupled to a channel configuration pin of the first connection interface unit, the memory control circuit unit and the rewritable non-volatile memory module are coupled to the power input terminal.

12. The power management method as claimed in claim 11 further comprising:

if the second power supply voltage is detected on the second power pin of the second connection interface unit, turning on the second switch circuit to receive the second power supply voltage from the external power supply device via the second power pin of the second connection interface unit, and supply the output voltage to the memory control circuit unit and the rewritable non-volatile memory module via the power output terminal.

13. The power management method as claimed in claim 12 further comprising:

if the electrical disconnection between the second connection interface unit and the external power supply device is detected, turning off the second switch circuit, and turning on the third switch circuit to receive the third power supply voltage via the channel configuration pin of the first connection interface unit, and supply the output voltage to the memory control circuit unit and the rewritable non-volatile memory module via the power output terminal.

14. The power management method as claimed in claim 13 further comprising:

if the first power supply voltage is detected on the first power pin of the first connection interface unit, turning off the third switch circuit, and turning on the first switch circuit to receive the first power supply voltage via the first power pin of the first connection interface unit, and supply the output voltage to the memory control circuit unit and the rewritable non-volatile memory module via the power output terminal.

15. The power management method as claimed in claim 14 further comprising:

adjusting the third power supply voltage received via the channel configuration pin of the first connection interface unit.

16. A memory storage device, comprising:

a rewritable non-volatile memory module;

a first connection interface unit, configured to connect to a host device;

a second connection interface unit; and a memory control circuit unit, coupled to the rewritable non-volatile memory, the first connection interface unit and the second connection interface unit, a power management circuit, coupled to the rewritable non-volatile memory module and the memory control circuit unit, wherein if an external power supply device is electrically connected to the second connection interface unit, the power management circuit receives a second power supply voltage from the external power supply device via the second connection interface unit, and supplies an operation voltage to the memory control circuit unit and the rewritable non-volatile memory module, wherein if the second connection interface is electrically disconnected with the external power supply device, the power management circuit receives a first power supply voltage from the host device via the first connection interface unit, and supplies the operation voltage to the memory control circuit unit and the rewritable non-volatile memory module.

17. The memory storage device as claimed in claim 10, wherein if the external power supply device is electrically connected with the second connection interface unit, the power management circuit transmits a first mode switching request to the host device, wherein the host device is switched to a power receiving mode according to the first mode switching request, wherein if the external power supply device is electrically disconnected with the second connection interface unit, the power management circuit transmits a second mode switching request to the host device, wherein the host device is switched to a power supplying mode according to the second mode switching request.

* * * * *